(12) United States Patent
Kim et al.

(10) Patent No.: US 10,818,871 B2
(45) Date of Patent: Oct. 27, 2020

(54) DISPLAY DEVICE, POLARIZING FILM AND METHOD FOR FABRICATING THE POLARIZING FILM

(71) Applicant: SAMSUNG DISPLAY CO., LTD., Yongin-si, Gyeonggi-do (KR)

(72) Inventors: Donghwan Kim, Seongnam-si (KR); Soonryong Park, Sejong-si (KR); Yunha Nam, Asan-si (KR); Sumin Lee, Seongnam-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/162,890

(22) Filed: Oct. 17, 2018

(65) Prior Publication Data
US 2019/0267569 A1  Aug. 29, 2019

(30) Foreign Application Priority Data
Feb. 27, 2018 (KR) .................. 10-2018-0023645

(51) Int. Cl.
*H01L 51/52* (2006.01)
*B29D 11/00* (2006.01)
*H01L 27/32* (2006.01)

(52) U.S. Cl.
CPC .... *H01L 51/5246* (2013.01); *B29D 11/00644* (2013.01); *H01L 27/3276* (2013.01); *H01L 51/5253* (2013.01); *H01L 51/5262* (2013.01); *H01L 51/5281* (2013.01)

(58) Field of Classification Search
CPC ......... H01L 2251/5338; H01L 51/0097; H01L 27/3244; H01L 51/5256; H01L 51/5237; H01L 27/322
See application file for complete search history.

(56) References Cited

U.S. PATENT DOCUMENTS

| | | | |
|---|---|---|---|
| 9,929,374 B2 | 3/2018 | Jin | |
| 2011/0299151 A1* | 12/2011 | Wu | G02F 1/133308 359/296 |
| 2014/0306941 A1* | 10/2014 | Kim | H04M 1/0268 345/204 |
| 2017/0262109 A1 | 9/2017 | Choi et al. | |
| 2017/0289324 A1 | 10/2017 | Yeo et al. | |
| 2017/0294621 A1* | 10/2017 | Higano | G02F 1/13452 |
| 2018/0123060 A1* | 5/2018 | Jang | H01L 27/124 |

(Continued)

FOREIGN PATENT DOCUMENTS

| | | |
|---|---|---|
| KR | 1020170106621 A | 9/2017 |
| KR | 1020170112790 A | 10/2017 |
| KR | 1020170115153 A | 10/2017 |

*Primary Examiner* — Jaehwan Oh
(74) *Attorney, Agent, or Firm* — Cantor Colburn LLP

(57) ABSTRACT

A display device includes a display panel including a flat portion and a bending portion located at a side of the flat portion, an optical film attached on the flat portion of the display panel, and a bending protection layer covering at least a part of the bending portion and contacting one edge of the optical film. The edge of the optical film includes an upper surface, a lower surface and a side surface, the lower surface of the optical film faces an upper surface of the display panel, at least a part of the side surface of the optical film contacts the bending protection layer, and at least a part of the side surface of the optical film protrudes more, as closer to the upper side.

21 Claims, 16 Drawing Sheets

(56) References Cited

U.S. PATENT DOCUMENTS

2018/0138207 A1    5/2018  Kim et al.
2018/0178483 A1*   6/2018  Chu ......................... B32B 3/30
2019/0219862 A1*   7/2019  Yoshida ............ G02F 1/133308

* cited by examiner

DISPLAY DEVICE, POLARIZING FILM AND METHOD FOR FABRICATING THE POLARIZING FILM

This application claims priority to Korean Patent Application No. 10-2018-0023645, filed on Feb. 27, 2018, and all the benefits accruing therefrom under 35 U.S.C. § 119, the content of which in its entirety is herein incorporated by reference.

1. FIELD

Exemplary embodiments of the invention relate to a display device, a polarizing film, and a method for fabricating the polarizing film.

2. DISCUSSION OF RELATED ART

Display devices are becoming increasingly important with a development of multimedia. Various types of display devices such as organic light emitting diode ("OLED") display devices, liquid crystal display ("LCD") devices, or the like are used in accordance with this trend.

Recent display devices maximize a display area for outputting visual information by bending one side of a substrate backwardly of the display area.

SUMMARY

In order to stably bend a panel as described above, a bending protection layer is disposed on the substrate to be bent. However, there is a risk that the bending protection layer may become detached due to a restoring force.

Exemplary embodiments of the invention may be directed to a display device capable of reducing the risk of detachment of a bending protection layer.

In addition, exemplary embodiments of the invention may be directed to a polarizing film capable of reducing the risk of detachment of a bending protection layer when the polarizing film is applied to display devices.

The objective of the invention is not limited to the above-mentioned problems, and other technical objectives may be clearly understood by those skilled in the art from the following description.

According to an exemplary embodiment, a display device includes a display panel including a flat portion and a bending portion located at a side of the flat portion, an optical film attached on the flat portion of the display panel, and a bending protection layer covering at least a part of the bending portion and contacting an edge of the optical film. The edge of the optical film includes an upper surface, a lower surface and a side surface, the lower surface of the optical film faces an upper surface of the display panel, at least a part of the side surface of the optical film contacts the bending protection layer, and at least a part of the side surface of the optical film protrudes more, as closer to the upper surface.

In an exemplary embodiment, an internal angle between at least a part of the side surface of the optical film and the lower surface of the optical film may be an obtuse angle.

In an exemplary embodiment, the internal angle may be greater than about 110 degrees.

In an exemplary embodiment, the internal angle may be greater than about 130 degrees.

In an exemplary embodiment, the internal angle may be less than about 160 degrees.

In an exemplary embodiment, the side surface of the optical film may be a planar surface.

In an exemplary embodiment, the display device may further include an adhesive layer between the optical film and the display panel. A side surface of the adhesive layer may contact the side surface of the optical film.

In an exemplary embodiment, the side surface of the adhesive layer may have a slope substantially equal to a slope of the side surface of the optical film.

In an exemplary embodiment, the side surface of the optical film may include a first surface that perpendicularly contacts the upper surface of the optical film.

In an exemplary embodiment, the side surface of the optical film may further include a second surface contacting the first surface and the lower surface of the optical film.

In an exemplary embodiment, the side surface of the optical film may further include a third surface contacting the first surface and parallel to the lower side of the optical film, and a fourth surface contacting the third surface and the lower surface of the optical film.

In an exemplary embodiment, the side surface of the optical film may include a protruding portion or a recessed portion.

In an exemplary embodiment, the side surface of the optical film may include a pattern of protruding portions or recessed portions that are regularly arranged.

In an exemplary embodiment, the side surface of the optical film may include a pattern of protruding portions or recessed portions that are irregularly arranged.

In an exemplary embodiment, the display panel may include an organic light emitting display panel, and the optical film may include a polarizing film.

In an exemplary embodiment, the display panel may include a passivation layer, and the edge of the optical film may be aligned with one edge of the passivation layer.

In an exemplary embodiment, at least a part of the lower surface of the optical film may contact the bending protection layer.

According to an exemplary embodiment, a display device includes a display panel including a flat portion and a bending portion located at a side of the flat portion; an optical film attached on the flat portion of the display panel; an adhesive layer between the display panel and the optical film; and a bending protection layer covering at least a part of the bending portion and contacting an edge of the optical film. The edge of the optical film includes a lower surface that faces the display panel, and at least a part of the lower surface of the optical film contacts the bending protection layer.

In an exemplary embodiment, at least a part of the lower surface of the optical film may not be covered by the adhesive layer.

In an exemplary embodiment, the bending protection layer may contact a side surface of the adhesive layer.

In an exemplary embodiment, a side surface of the adhesive layer may be a concavely curved surface which is recessed inwardly.

In an exemplary embodiment, the display panel may include a passivation layer, and the edge of the optical film may be aligned with an edge of the passivation layer.

According to an exemplary embodiment, a polarizing film includes a plurality of edges. One of the plurality of edges includes a lower surface, an upper surface, and a side surface, an adhesive layer is attached to the lower surface of the polarizing film, and at least a part of the side surface of the optical film protrudes more, as closer to the upper side.

In an exemplary embodiment, an internal angle between at least a part of the side surface of the optical film and the lower surface of the optical film may be an obtuse angle.

In an exemplary embodiment, the side surface of the adhesive layer and the side surface of the optical film may define a substantially same surface.

In an exemplary embodiment, the side surface of the optical film may include a first surface that perpendicularly contacts the upper surface of the optical film.

In an exemplary embodiment, the side surface of the optical film may include a protruding portion or a recessed portion.

According to an exemplary embodiment, a polarizing film includes a plurality of edges; and an adhesive layer on a lower surface of the polarizing film. At least a part of the lower surface of at least one of the plurality of edges is not covered by the adhesive layer.

According to an exemplary embodiment, a method for fabricating a polarizing film includes attaching an adhesive layer to a surface of the polarizing film; attaching a protective film to the adhesive layer; pressing the polarizing film to which the adhesive layer is attached so that the adhesive layer is stretched in a horizontal direction parallel to the surface of the polarizing film; cutting an edge of the polarizing film to which the adhesive layer is attached in a pressurized state; and stopping the pressing of the polarizing film to which the adhesive layer is attached so that the adhesive layer is reduced in the horizontal direction.

In an exemplary embodiment, the method may further include overlapping a plurality of polarizing films, each attached with the adhesive layer and the protective film. The cutting the edge of the polarizing film may include cutting an edge of the plurality of overlapped polarizing films.

In an exemplary embodiment, the cutting the one edge of the polarizing film may include cutting the polarizing film so that a cut surface of the polarizing film is perpendicular to the surface of the polarizing film.

In an exemplary embodiment, the cutting the one edge of the polarizing film may include cutting the polarizing film so that an internal angle between a cut surface of the polarizing film and the surface of the polarizing film is an obtuse angle.

The foregoing is illustrative only and is not intended to be in any way limiting. In addition to the illustrative exemplary embodiments and features described above, further exemplary embodiments and features will become apparent by reference to the drawings and the following detailed description.

BRIEF DESCRIPTION OF THE DRAWINGS

A more complete appreciation of the invention will become more apparent by describing in detail embodiments thereof with reference to the accompanying drawings, in which.

DETAILED DESCRIPTION

Figure 1:
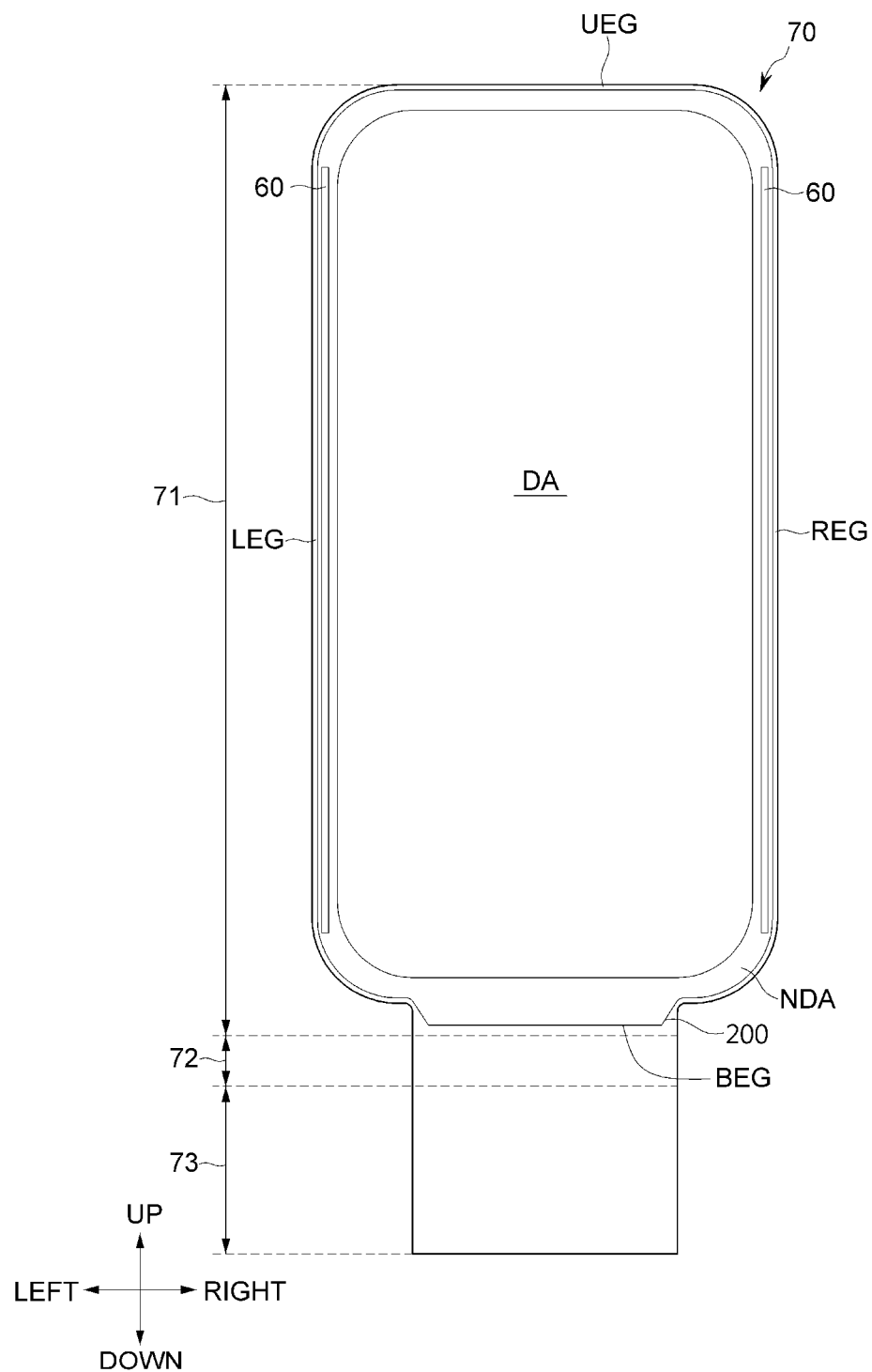
FIG. 1 is a plan view illustrating an exemplary embodiment of an organic light emitting diode ("OLED") display device according to the invention.

Exemplary embodiments will now be described more fully hereinafter with reference to the accompanying drawings. Although the invention may be modified in various manners and have several exemplary embodiments, exemplary embodiments are illustrated in the accompanying drawings and will be mainly described in the specification. However, the scope of the invention is not limited to the exemplary embodiments and should be construed as including all the changes, equivalents and substitutions included in the spirit and scope of the invention.

In the drawings, thicknesses of a plurality of layers and areas are illustrated in an enlarged manner for clarity and ease of description thereof. When a layer, area, or plate is referred to as being "on" another layer, area, or plate, it may be directly on the other layer, area, or plate, or intervening layers, areas, or plates may be present therebetween. Conversely, when a layer, area, or plate is referred to as being "directly on" another layer, area, or plate, intervening layers, areas, or plates may be absent therebetween. Further when a layer, area, or plate is referred to as being "below" another layer, area, or plate, it may be directly below the other layer, area, or plate, or intervening layers, areas, or plates may be present therebetween. Conversely, when a layer, area, or plate is referred to as being "directly below" another layer, area, or plate, intervening layers, areas, or plates may be absent therebetween.

The spatially relative terms "below", "beneath", "less", "above", "upper" or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in the other direction and accordingly the spatially relative terms may be interpreted differently depending on the orientations.

Throughout the specification, when an element is referred to as being "connected" to another element, the element is "directly connected" to the other element, or "electrically connected" to the other element with one or more intervening elements interposed therebetween. It will be further understood that the terms "comprises," "including," "includes" and/or "including," when used in this specification, specify the presence of stated features, integers, steps, operations, elements and/or components, but do not preclude the presence or addition of one or more other features, integers, steps, operations, elements, components and/or groups thereof.

It will be understood that, although the terms "first," "second," "third," or the like may be used herein to describe various elements, these elements should not be limited by these terms. These terms are only used to distinguish one element from another element. Accordingly, "a first element" discussed below could be termed "a second element" or "a third element," and "a second element" and "a third element" may be termed likewise without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined, all terms used herein (including technical and scientific terms) have the same meaning as commonly understood by those skilled in the art to which this invention pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

Some of the parts which are not associated with the description may not be provided in order to specifically describe exemplary embodiments of the invention and like reference numerals refer to like elements throughout the specification.

Hereinafter, exemplary embodiments of the invention will be described with reference to the accompanying drawings.

As used herein, display devices are display devices for displaying moving images or still images. The display devices may be used as a display screen for various products such as televisions, notebooks, monitors, billboards, and internet of things, in addition to portable electronic devices such as mobile phones, smart phones, tablet personal computers ("PCs"), smart watches, watch phones, mobile communication terminals, electronic notebooks, electronic books, portable multimedia players ("PMPs"), navigation, and ultra mobile personal computers ("UMPCs"). Examples of the display device may include organic light emitting diode ("OLED") display devices, LCD devices, plasma display panel ("PDP") devices, field emission display ("FED") devices, electrophoretic display ("EPD") devices, or the like.

The display devices may include an optical film. The optical film may be attached on the display panel of the display device to modulate or improve the optical characteristics. The optical film may include a polarizing film. For example, the polarizing film may be attached to the display surface of the OLED display device to reduce reflection of external light, or may be attached to a display panel of the LCD device to adjust transmittance. Examples of the optical film may include a retardation film, a prism film, a micro lens film, a lenticular film, a release film, a protective film, or the like, and the optical film may be attached to the display device to be used according to various purposes of use.

Hereinafter, a polarizing film will be described as an optical film according to an exemplary embodiment of the invention, and an OLED display device will be described as a display device according to an exemplary embodiment of the invention, but the invention is not limited thereto.

Figure 2:
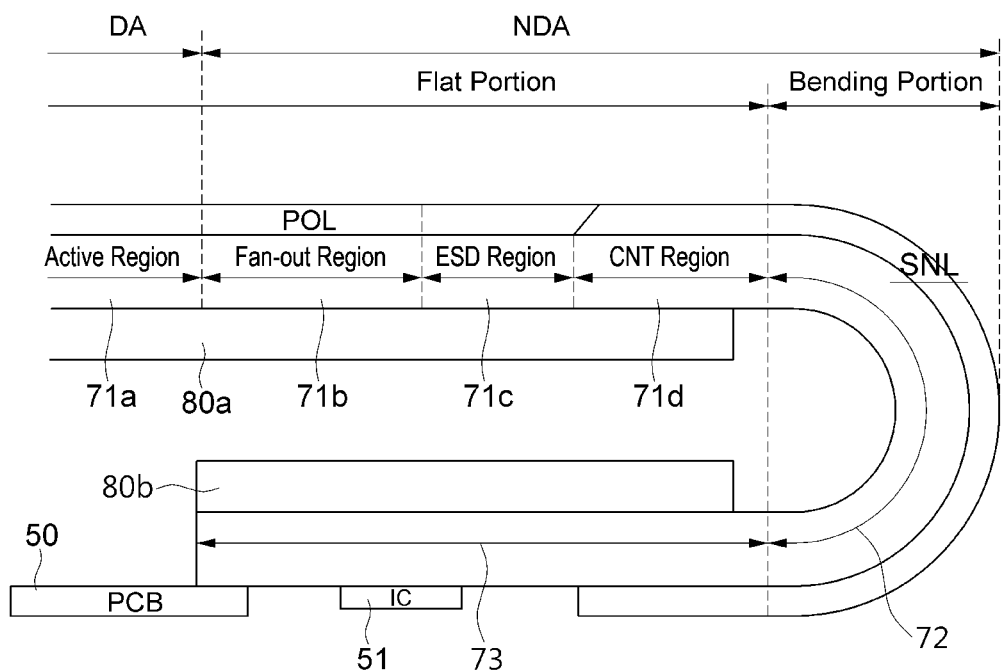
FIG. 2 is a partial schematic cross-sectional view illustrating an exemplary embodiment of an OLED display device according to the invention.

FIG. 1 is a plan view illustrating an OLED display device according to an exemplary embodiment of the invention, and FIG. 2 is a partial schematic cross-sectional view illustrating an OLED display device according to an exemplary embodiment of the invention. In the plan view of FIG. 1, the upper, lower, left, and right directions are defined for convenience of explanation. The up and down direction is the vertical direction or the column direction, and the left and right direction is the horizontal direction or the row direction. As used herein, the terms "upper edge", "lower edge", "left edge", and "right edge" of the polarizing film or the like refer to edges or ends located on the upper side, the lower side, the left side, and the right side of the polarizing film in a plan view, respectively. It should be understood that the directions mentioned in the exemplary embodiments of the invention are referred to as relative directions, and the invention is not limited to the mentioned directions.

Referring to FIGS. 1 and 2, an OLED display device 70 includes a display area DA and a non-display area NDA around the display area DA.

The display area DA is an area for displaying images on a screen. The planar shape of the display area DA may be a quadrangular shape or a quadrangular shape with rounded corners. As used herein, an upper side, a lower side, a left side, and a right side of the quadrangular shape will be referred to as an upper edge, a lower edge, a left edge, and a right edge, respectively. The planar shape of the display area DA is not limited to a quadrangle, and the display area DA may have various shapes such as a circular shape and an elliptical shape. The display area DA includes an active region 71a including a plurality of pixels. The cross-sectional structure of the pixel will be described below with reference to FIG. 3.

The non-display area NDA is arranged around the display area DA. The non-display area NDA may constitute the edge of the OLED display device 70.

A driver for driving pixel circuits of the display area DA may be disposed in the non-display area NDA. The driver may include a driving circuit and a driving wiring for transmitting a driving signal.

The OLED display device 70 may include a polarizing (refer to 'POL' in FIGS. 2 and 3) film 200 disposed on a display surface. The polarizing film 200 may be attached on the display surface of the OLED display device 70 through an adhesive layer 400. The polarizing film 200 may include four edges (or ends) of a lower edge BEG, an upper edge UEG, a left edge LEG, and a right edge REG. The lower edge BEG and the upper edge UEG of the polarizing film 200 may face each other, and the left edge LEG and the right edge REG of the polarizing film 200 may face each other.

The polarizing film 200 may cover the entire display area DA. In addition, the polarizing film 200 may extend outwardly from an outer edge of the display area DA to cover at least a part of the non-display area NDA. In an exemplary embodiment, the upper edge UEG, the left edge LEG and the right edge REG of the polarizing film 200 may be aligned with an upper edge, a left edge, and a right edge of the non-display area NDA, respectively, for example. The lower edge BEG of the polarizing film 200 may be located more inwardly than a lower edge BEG of the non-display area NDA (i.e. between the lower edge of the display area DA and the lower edge of the non-display area NDA), so that a part of the non-display area NDA on the side of the lower edge BEG may be exposed. However, the invention is not limited thereto, and a part of the non-display area NDA may be exposed on the side of another edge. A side surface of at least one edge of the polarizing film 200 may have an asymmetric shape in the thickness direction, and may have an inclination so that the upper side protrudes more than the lower side in the thickness direction, a detailed description of which will be described below.

In an exemplary embodiment of the invention, the OLED display device 70 may include a flat portion and a bending portion. The flat portion includes an upper flat portion 71 and a lower flat portion 73 which overlap each other in the thickness direction (e.g., vertical direction in FIG. 2), and further includes a bending portion 72 between the two flat portions 71 and 73. The bending portion 72 may be bent in the direction opposite to the display direction (e.g., the lower direction in FIG. 2 in a case of a top emission type) with respect to the upper flat portion 71. The bending portion 72 may be disposed on at least one side of the upper flat portion 71. Although it is illustrated in the drawings that one bending portion 72 is disposed close to a lower edge of the upper flat portion 71, the bending portion 72 may be disposed on the side of two or more edges of the upper flat portion 71. In an exemplary embodiment, the bending portion 72 may be disposed on the side of the lower edge and an upper edge of the upper flat portion 71, for example. In addition, the bending portion 72 may be disposed adjacent to other edges, e.g., a left edge, a right edge, or an upper edge, other than the lower edge of the upper flat portion 71.

The display area DA and a part of the non-display area NDA may be disposed at the upper flat portion 71. Another part of the non-display area NDA may be disposed at the bending portion 72 and the lower flat portion 73. Accordingly, when at least a part of the non-display area NDA is bent in a direction opposite to the display direction, the bezel of the OLED display device 70 may be reduced.

First, the non-display area NDA located at the upper flat portion 71 will be described. A scan driver 60 may be disposed at the non-display area NDA adjacent to the left edge and/or the right edge of the display area DA. The scan driver 60 may include a scan driver circuit and a scan signal wiring for transmitting a scan signal output from the scan driver circuit.

A driving signal wiring for transmitting a driving signal from a driving chip 51 may be disposed in the non-display area NDA adjacent to the lower edge of the display area DA. The driving chip 51 may be directly disposed (e.g., mounted) in the non-display area NDA of the lower flat portion 73 or the bending portion 72 so as to be connected to the driving signal wiring. In an alternative exemplary embodiment, a printed circuit board 50 on which the driving chip 51 is disposed (e.g., mounted) may be attached to the lower flat portion 73 or the bending portion 72 such that the driving chip 51 and the driving signal wiring in the non-display area NDA may be electrically connected to each other.

A part of the non-display area NDA of the upper flat portion 71 adjacent to the lower edge of the display area DA may include a fan-out region 71b, an electrostatic dispersion region 71c (refer to 'ESD Region' in FIG. 2), and a wiring contact region 71d (refer to 'CNT Region' in FIG. 2) which are disposed sequentially in an outward direction (e.g., right direction in FIG. 2). The bending portion 72 may be disposed adjacent to an outer side of the wiring contact region 71d.

A wiring for transmitting signals to each of a data line, a power voltage line, and a scan driver in the display area DA may be disposed at the fan-out region 71b.

The electrostatic dispersion region 71c includes an electrostatic dispersion circuit. The electrostatic dispersion circuit serves to eliminate the static electricity that may be generated in the manufacturing process or driving, thereby preventing damage to the pixel circuits in the active region 71a in the display area DA or the scan driving circuit of the scan driver 60. The electrostatic dispersion circuit may include at least one electrostatic diode. In an exemplary embodiment, the electrostatic diode may include one or more thin film transistors.

The wiring contact region 71d includes a contact (refer to 'CNT1' in FIG. 5) for electrically connecting wirings of different layers. A signal wiring (e.g., including a first or second gate conductive layer) (refer to 'SWR' in FIG. 5) extending from the display area DA through the fan-out region 71b and the electrostatic dispersion region 71c may be electrically connected to a bending wiring (e.g., including a first and second source/drain conductive layer) (refer to 'BWR' in FIG. 5) that is located on a different layer through a contact (refer to 'CNT1' in FIG. 5) of the wiring contact region 71d.

The bending wiring may extend from the bending portion 72 to the lower flat portion 73. The bending wiring may be electrically connected to a driving wiring (e.g., including a first or second gate conductive layer) that is located on a different layer through a contact (not shown) located at the lower flat portion 73. The driving chip 51 or the printed circuit board 50 on which the driving chip 51 is disposed (e.g., mounted) may be electrically connected to a pad of the driving wiring through an anisotropic conductive film or the like.

A bending protection layer 300 (refer to 'SNL' in FIGS. 2 and 5) may be disposed at the bending portion 72. The bending protection layer 300 (refer to FIG. 5) may serve to protect a substrate (refer to '20' in FIG. 3) and the bending wiring, and to reduce bending stress by covering the bending portion 72. The bending protection layer 300 may partially extend to the upper flat portion 71 and the lower flat portion 73, and may contact the lower edge BEG of the polarizing film 200. The bending protection layer 300 may be partially removed from an area disposed (e.g., mounted) with the driving chip 51 and the printed circuit board 50 of the lower flat portion 73 to expose the driving wiring pad.

In an exemplary embodiment, a horizontal width (e.g., along a horizontal direction in FIG. 1) of the bending portion 72 and the lower flat portion 73 may be less than a horizontal width of the upper flat portion 71 across the display area DA. In addition, similar to the bending portion 72, a horizontal width of the wiring contact region 71d, the electrostatic dispersion region 71c, the fan-out region 71b of the upper flat portion 71 adjacent to the bending portion 72 may be less than the horizontal width of the upper flat portion 71 across the display area DA.

The polarizing film 200 may cover the display area DA of the upper flat portion 71, cover the fan-out region 71b of the non-display area NDA, and cover at least a part of the electrostatic dispersion region 71c. The polarizing film 200 may expose the bending portion 72, and expose at least a part of the wiring contact region 71d of the upper flat portion 71. The lower edge BEG of the polarizing film 200 may be positioned between the electrostatic dispersion region 71c and the wiring contact region 71d. It is illustrated in the drawings that the lower edge BEG of the polarizing film 200 is located at a boundary between the electrostatic dispersion region 71c and the wiring contact region 71d, but the lower edge BEG of the polarizing film 200 may be disposed on the electrostatic dispersion region 71c or on the wiring contact region 71d.

A side surface of the lower edge BEG of the polarizing film 200 may contact a side surface of the bending protection layer 300. In an exemplary embodiment, an upper side of at least a part of the side surface of the lower edge BEG of the polarizing film 200 protrudes more, as compared to a lower side thereof, and thus the side surface of the lower edge BEG of the polarizing film 200 faces downwardly, which is the direction from an upper surface to a lower surface. In addition, the side surface of the bending protection layer 300 may have an inclined surface corresponding thereto. An inclination angle of the side surface of the polarizing film 200 and an inclination angle of the side surface of the bending protection layer 300 which contact each other may be about 180 degrees, for example.

Pattern films 80a and 80b are attached beneath the upper flat portion 71 and the lower flat portion 73 by an adhesive layer (not shown). The pattern film 80a on the upper side may extend at the upper flat portion 71 to the boundary with the bending portion 72. The pattern film 80b on the lower side may extend at the lower flat portion 73 to the boundary with the bending portion 72. Edges of the pattern films 80a and 80b toward the bending portion 72 may be spaced apart from the boundary with the bending portion 72. The pattern films 80a and 80b serve to support the flat portions 71 and 73 of a display panel 100 and allow the bending portion 72 to maintain a gentle curve having a constant curvature.

Hereinafter, the cross-sectional structure of the OLED display device will be described in more detail.

Figure 3:
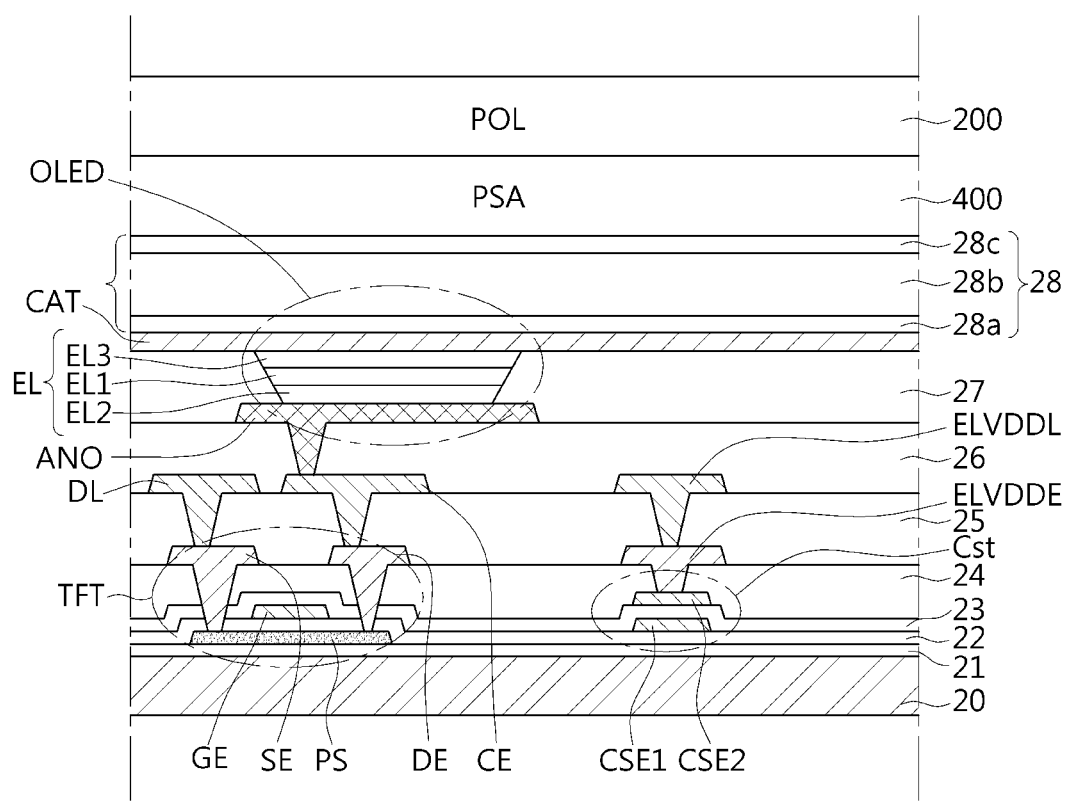
FIG. 3 is a cross-sectional view illustrating one pixel of an OLED display device.

FIG. 3 is a cross-sectional view illustrating one pixel of an OLED display device.

Referring to FIG. 3, the pixel of the OLED display device 70 includes at least one thin film transistor TFT, a storage capacitor Cst, and an OLED disposed on a substrate 20. The thin film transistor TFT includes a semiconductor layer PS, a gate electrode GE, a source electrode SE, and a drain electrode DE. The storage capacitor Cst includes a first electrode CSE1 and a second electrode CSE2. The OLED includes an anode electrode ANO, a cathode electrode CAT, and an organic layer EL disposed therebetween.

The substrate 20 supports each layer disposed thereon. The substrate 20 may include an insulating material. In an exemplary embodiment, the substrate 20 may include an inorganic material such as glass or quartz, or may include an organic material such as polyimide. The substrate 20 may be a rigid substrate or a flexible substrate.

A buffer layer 21 is disposed on the substrate 20. The buffer layer 21 may substantially prevent diffusion of impurity ions, substantially prevent penetration of moisture or outside air, and perform a surface planarization function. In an exemplary embodiment, the buffer layer 21 may include an insulating material, and may include silicon nitride, silicon oxide, silicon oxynitride, or the like, for example.

The semiconductor layer PS is disposed on the buffer layer 21. The semiconductor layer PS forms a channel of the thin film transistor TFT. The semiconductor layer PS may include polycrystalline silicon. Impurity ions (e.g., p-type impurity ions in a case of a PMOS transistor) may be doped at a portion (source/drain region) of the semiconductor layer PS connected to the source/drain electrodes SE and DE of the thin film transistor TFT. In an exemplary embodiment, a trivalent dopant such as boron (B) may be used as a p-type impurity ion, for example. In another exemplary embodiment, the semiconductor layer PS may include monocrystalline silicon, low temperature polycrystalline silicon, amorphous silicon, or an oxide semiconductor such as indium tin zinc oxide ("ITZO") or indium gallium zinc oxide ("IGZO").

A gate insulating layer 22 is disposed on the semiconductor layer PS.

A first gate conductive layer is disposed on the gate insulating layer 22. The first gate conductive layer includes the gate electrode GE of the thin film transistor TFT and the first electrode CSE1 of the storage capacitor Cst. In addition, the first gate conductive layer may include a scan signal wiring for transmitting a scan signal to the gate electrode GE.

A first insulating interlayer 23 is disposed on the first gate conductive layer.

Each of the gate insulating layer 22 and the first insulating interlayer 23 may include an inorganic material such as silicon oxide, silicon nitride, silicon oxynitride, or the like.

A second gate conductive layer is disposed on the first insulating interlayer 23. The second gate conductive layer may include the second electrode CSE2 of the storage capacitor Cst. The first electrode CSE1 and the second electrode CSE2 may form the storage capacitor Cst including the first insulating interlayer 23 as a dielectric layer.

In an exemplary embodiment, each of the first gate conductive layer and the second gate conductive layer may include one or more metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu), for example. Each of the first gate conductive layer and the second gate conductive layer may have a single-layered structure or a multilayered structure.

A second insulating interlayer 24 is disposed on the second gate conductive layer. However, the second insulating interlayer 24 may include an inorganic layer or an organic layer including an organic material.

A first source/drain conductive layer is disposed on the second insulating interlayer 24. The first source/drain conductive layer may include the source electrode SE and the drain electrode DE of the thin film transistor TFT and a power voltage electrode ELVDDE. The source electrode SE and the drain electrode DE of the thin film transistor TFT may be electrically connected to the source region and the drain region of the semiconductor layer PS through a contact hole defined through the second insulating interlayer 24, the first insulating interlayer 23, and the gate insulating layer 22.

A first via layer 25 is disposed on the first source/drain conductive layer.

A second source/drain conductive layer is disposed on the first via layer 25. The second source/drain conductive layer may include a data signal line DL, a connection electrode CE, and a power voltage line ELVDDL.

The data signal line DL may be electrically connected to the source electrode SE of the thin film transistor TFT through a contact hole defined through the first via layer 25. The connection electrode CE may be electrically connected to the drain electrode DE of the thin film transistor TFT through a contact hole defined through the first via layer 25. The power voltage line ELVDDL may be electrically connected to the power voltage electrode ELVDDE through a contact hole defined through the first via layer 25.

Each of the first source/drain conductive layer and the second source/drain conductive layer may include one or more metal of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and copper (Cu). Each of the first source/drain conductive layer and the second source/drain conductive layer may have a single-layered structure or a multilayered structure.

A second via layer 26 is disposed on the second source/drain conductive layer. The first via layer 25 and the second via layer 26 described above may be an organic layer including an organic insulating material.

The anode electrode ANO is disposed on the second via layer 26. The anode electrode ANO is connected to the connection electrode CE through a contact hole defined through the second via layer 26, and may be electrically connected to the drain electrode DE of the thin film transistor TFT through the contact hole.

A pixel defining layer 27 may be disposed on the anode electrode ANO. An opening that exposes the anode electrode ANO may be defined in the pixel defining layer 27. The pixel defining layer 27 may include an organic insulating material or an inorganic insulating material.

An organic layer EL is disposed in the opening of the pixel defining layer 27. The organic layer EL may include an organic light emitting layer EL1, a hole injection/transport layer EL2, and an electron injection/transport layer EL3. It is exemplified in the drawings that each of the hole injection/transport layer EL2 and the electron injection/transport layer EL3 is provided as one layer, but a plurality of layers of the injection layer and the transport layer may be stacked. In addition, at least one of the hole injection/transport layer EL2 and the electron injection/transport layer EL3 may be a common layer disposed over a plurality of pixels.

The cathode electrode CAT is disposed on the organic layer EL and the pixel defining layer 27. The cathode electrode CAT may be a common electrode disposed over a plurality of pixels.

A passivation layer 28 may be disposed on the cathode electrode CAT. The passivation layer 28 includes an inorganic material. The passivation layer 28 may include a plurality of stacked layers. In an exemplary embodiment, the passivation layer 28 may include a first inorganic layer 28a, an organic layer 28b, and a second inorganic layer 28c which are sequentially stacked, for example.

An adhesive layer 400 may be disposed on the passivation layer 28, and a polarizing film 200 may be disposed on the adhesive layer 400.

Figure 4:
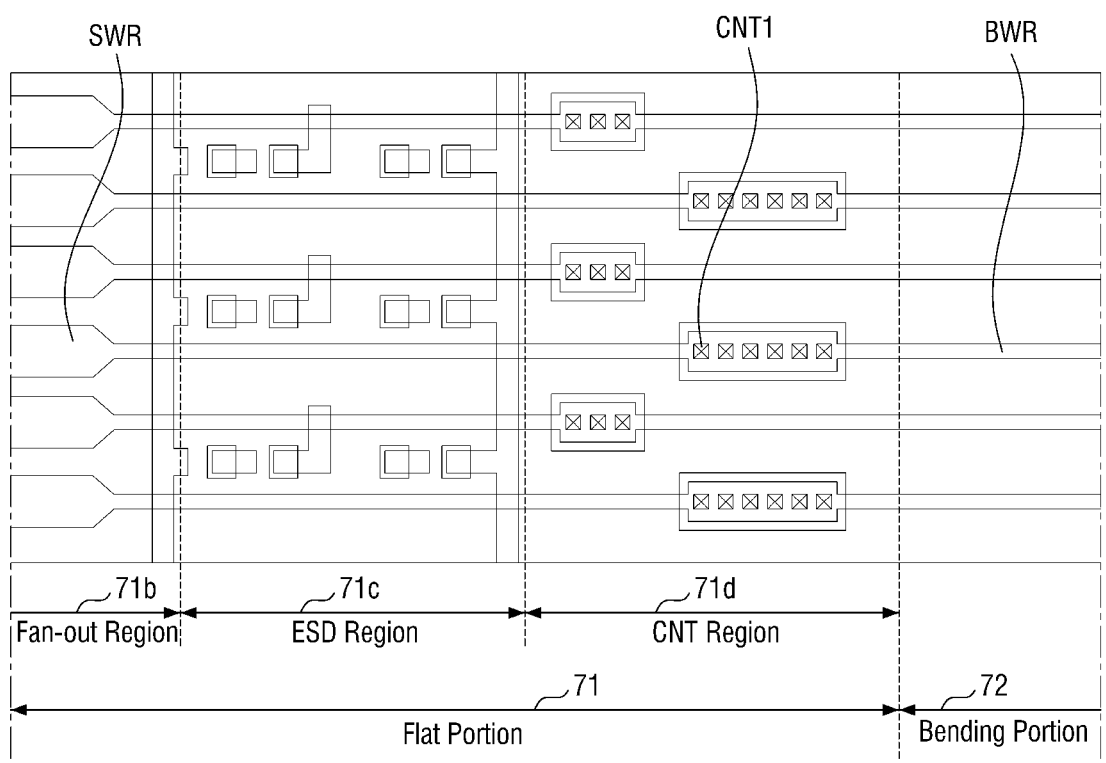
FIG. 4 is a partial plan view illustrating an exemplary embodiment of an OLED display device according to the invention.
Figure 5:
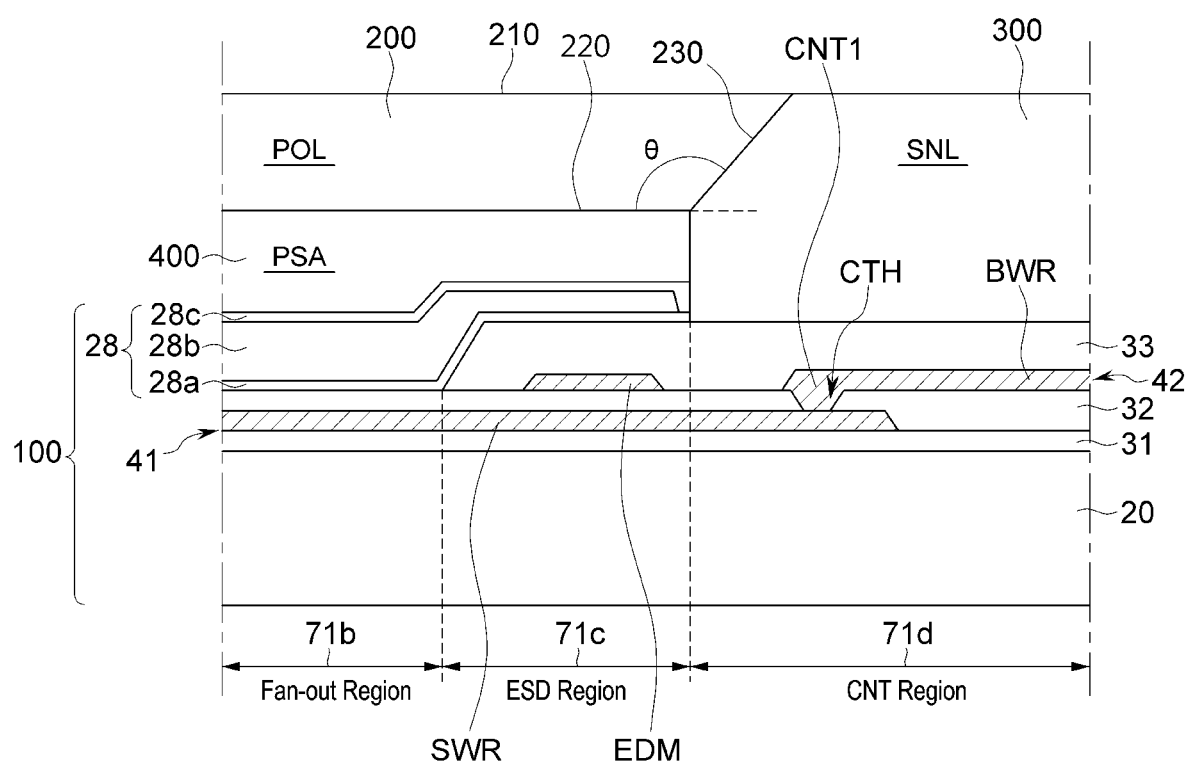
FIG. 5 is a schematic cross-sectional view illustrating the OLED display device of FIG. 4.

FIG. 4 is a partial plan view illustrating an OLED display device according to an exemplary embodiment of the invention. FIG. 5 exemplifies a partial plan view of a non-display area adjacent to the lower edge of the display area of FIG. 1. FIG. 5 is a schematic cross-sectional view illustrating the OLED display device of FIG. 4. In the cross-sectional view of FIG. 5, the insulating layer and the conductive layer are simplified for convenience of explanation.

Referring to FIGS. 4 and 5, a first insulating layer 31, a first conductive layer 41, a second insulating layer 32, a second conductive layer 42, and a third insulating layer 33 are sequentially disposed on the substrate 20. The first conductive layer 41 and the second conductive layer 42 are electrically connected to each other in the wiring contact region 71d through the contact CNT1.

The first conductive layer 41 and the second conductive layer 42 are conductive layers disposed on layers different from each other, and the second conductive layer 42 may be disposed above the first conductive layer 41. In an exemplary embodiment, the first conductive layer 41 may include the first gate conductive layer or the second gate conductive layer of FIG. 3, and the second conductive layer 42 may include the first source/drain conductive layer or the second source/drain conductive layer of FIG. 3, for example. In the case where, for example, the first conductive layer 41 includes the first gate conductive layer and the second conductive layer 42 includes the first source/drain conductive layer, the first insulating layer 31 may include the buffer layer 21, the gate insulating layer 22, the first insulating interlayer 23 of FIG. 3, the second insulating layer 32 may include the second insulating interlayer 24 of FIG. 3, and the third insulating layer 33 may include the first via layer 25, the second via layer 26, and the pixel defining layer 27 of FIG. 3.

The first insulating layer 31 is disposed on the substrate 20, and may be disposed over the fan-out region 71b, the electrostatic dispersion region 71c, and the wiring contact region 71d.

The first conductive layer 41 includes the signal wiring SWR. The signal wiring SWR may extend from the fan-out region 71b to the wiring contact region 71d via the electrostatic dispersion region 71c.

The second insulating layer 32 may cover the first conductive layer 41.

The second conductive layer 42 is disposed on the first insulating layer 31. The second conductive layer 42 includes the bending wiring BWR. The bending wiring BWR partially overlaps the first conductive layer 41 in the wiring contact region 71d and is electrically connected to the first conductive layer 41 through a contact hole CTH defined through the second insulating layer 32. The second conductive layer 42 may also be disposed in the electrostatic dispersion region 71c (refer to 'EDM') to form the electrostatic dispersion circuit together with the first conductive layer 41.

The third insulating layer 33 covers the second conductive layer 42. It is exemplified in the drawings that the third insulating layer 33 is disposed in the electrostatic dispersed region 71c and the wiring contact region 71d, and is not disposed in the fan-out region 71b. However, the invention is not limited thereto, and the third insulating layer 33 may also be disposed in the fan-out region 71b.

The passivation layer 28 is disposed on the third insulating layer 33. The passivation layer 28 may include the first inorganic layer 28a, the organic layer 28b, and the second inorganic layer 28c. A side surface of the organic layer 28b may be covered with the second inorganic layer 28c.

The passivation layer 28 covers the display area DA, and extends to the non-display area NDA adjacent to the lower edge of the display area DA to cover the fan-out region 71b and the electrostatic dispersion region 71c. On a plane, a lower edge of the passivation layer 28 may be positioned between the electrostatic dispersion region 71c and the wire contact region 71d. Although it is exemplified in the drawings that a side surface of the lower edge of the passivation layer 28 is located at the boundary between the electrostatic dispersing region 71c and the wiring contact region 71d, the side surface of the lower edge of the passivation layer 28 may be located on the electrostatic dispersion region 71c, or on the wiring contact region 71d.

The adhesive layer 400 and the polarizing film 200 are disposed on the passivation layer 28. Lower edges of the polarizing film 200 and the adhesive layer 400 may be aligned with the lower edge of the passivation layer 28 in a plan view.

At least a part of a side surface 230 of the lower edge BEG of the polarizing film 200 faces downwardly in the thickness direction, that is, the direction from an upper surface 210 of the polarizing film 200 to a lower surface 220 of the polarizing film 200. Referring to FIG. 5, at least a part of the side surface 230 of the lower edge BEG of the polarizing film 200 has an inclined surface that protrudes more, as closer to the upper side.

In an exemplary embodiment, an inclination angle θ of a portion of the side surface 230 of the lower edge BEG of the polarizing film 200 (or an internal angle between the side surface 230 and the lower surface 220) may be an obtuse angle, i.e., greater than about 90 degrees and less than about 180 degrees, for example. When the polarizing film 200 including the side surface having an obtuse inclination angle is aligned with the passivation layer 28 therebeneath, a reference plane is the lower surface 220 of the polarizing film 200. In such an exemplary embodiment, the upper surface 210 of the polarizing film 200 may be located more outwardly than the side surface of the passivation layer 28.

In addition, an inclination angle of a portion of the side surface 230 may be about 180 degrees, that is, the portion of the side surface 230 may be parallel to the lower surface, for example. Accordingly, at this position, the upper surface 210 of the polarizing film 200 may protrude more outwardly than the lower surface 220 of the polarizing film 200. The detailed shape of the polarizing film 200 will be described below with reference to FIGS. 7 to 13.

The adhesive layer 400 may contact the lower surface 220 of the polarizing film 200. In an exemplary embodiment, the adhesive layer 400 may include a pressure sensitive adhesive ("PSA"). A planar shape of the adhesive layer 400 may be substantially the same as a planar shape of the lower surface 220 of the polarizing film 200. In an alternative exemplary embodiment, the planar shape of the adhesive layer 400 may be less than the planar shape of the lower surface 220 of the polarizing film 200 so that a part of the lower surface 220 may be exposed at the lower edge BEG, which will be described below with reference to FIG. 14. An inclination angle of a side surface of a lower edge of the adhesive layer 400 located under the polarizing film 200 may be perpendicular. In addition, side surfaces of the remaining edges of the adhesive layer 400 may have a perpendicular inclination angle irrespective of whether the edge of the polarizing film 200 thereabove has an asymmetric shape. In an alternative exemplary embodiment, the side surface of the lower edge of the adhesive layer 400 may have an inclination angle substantially equal to that of the side surface 230 of the polarizing film 200. The inclination angle of the edge of the adhesive layer 400 is not limited by the above examples, and may have various shapes or inclination angles.

The side surface 230 of the lower edge BEG of the polarizing film 200 may be disposed on a plane and its cross-section may be linear. In an alternative exemplary embodiment, the side surface 230 of the lower edge BEG of the polarizing film 200 may include a plurality of planes having different slopes from each other.

The bending protection layer 300 may be disposed on the third insulating layer 33 at the wiring contact region 71d which is not covered with the passivation layer 28. The side surface of the bending protection layer 300 may contact the side surface of the passivation layer 28, the side surface of the adhesive layer 400, and the side surface 230 of the polarizing film 200. The bending protection layer 300 may include an organic material and may cover a side profile that includes the passivation layer 28, the adhesive layer 400, and the polarizing film 200. Accordingly, the inclination angle of the side surface of the bending protection layer 300 corresponds to the inclination angle of the side surface of the passivation layer 28, the side surface of the adhesive layer 400, and the side surface of the polarizing film 200. The sum of the side inclination angle of two members whose side inclination angles correspond to each other may be about 180 degrees, for example. In an exemplary embodiment, the inclination angle of the side surface of the bending protection layer 300 at a portion where the bending protection layer 300 contacts the passivation layer 28 and the adhesive layer 400 may be about 90 degrees, while the inclination angle of the side surface of the bending protection layer 300 at a portion where the bending protection layer 300 contacts the polarizing film 200 may be in a range from about 0 degree to about 89 degrees, for example.

The bending protection layer 300 may be located on the side surface 230 of the polarizing film 200, but the bending protection layer 300 or the constituent material thereof may not be located on the upper surface 210 of the polarizing film 200. It is exemplified in the drawings that a height of an upper surface of the bending protection layer 300 is substantially equal to a height of the upper surface 210 of the polarizing film 200 so that the bending protection layer 300 completely covers the side surface 230 of the polarizing film 200, but the height of the upper surface of the bending protection layer 300 may be less than the height of the upper surface 210 of the polarizing film 200 and thus the bending protection layer 300 may expose a part of an upper end of the side surface 230 of the polarizing film 200. In addition, the height of the upper surface of the bending protection layer 300 may be greater than the height of the upper surface 210 of the polarizing film 200.

As further described in the following descriptions of the OLED display device, when one side surface 230 of the polarizing film 200 that contacts the bending protection layer 300 faces downwardly, the upward restoring force of the bending protection layer 300 is canceled, and thus the risk of detachment of the bending protection layer 300 may be reduced. In addition, the contact area between the polarizing film 200 and the bending protection layer 300 may be increased to increase the adhesive force of the bending protection layer 300.

Figure 6:
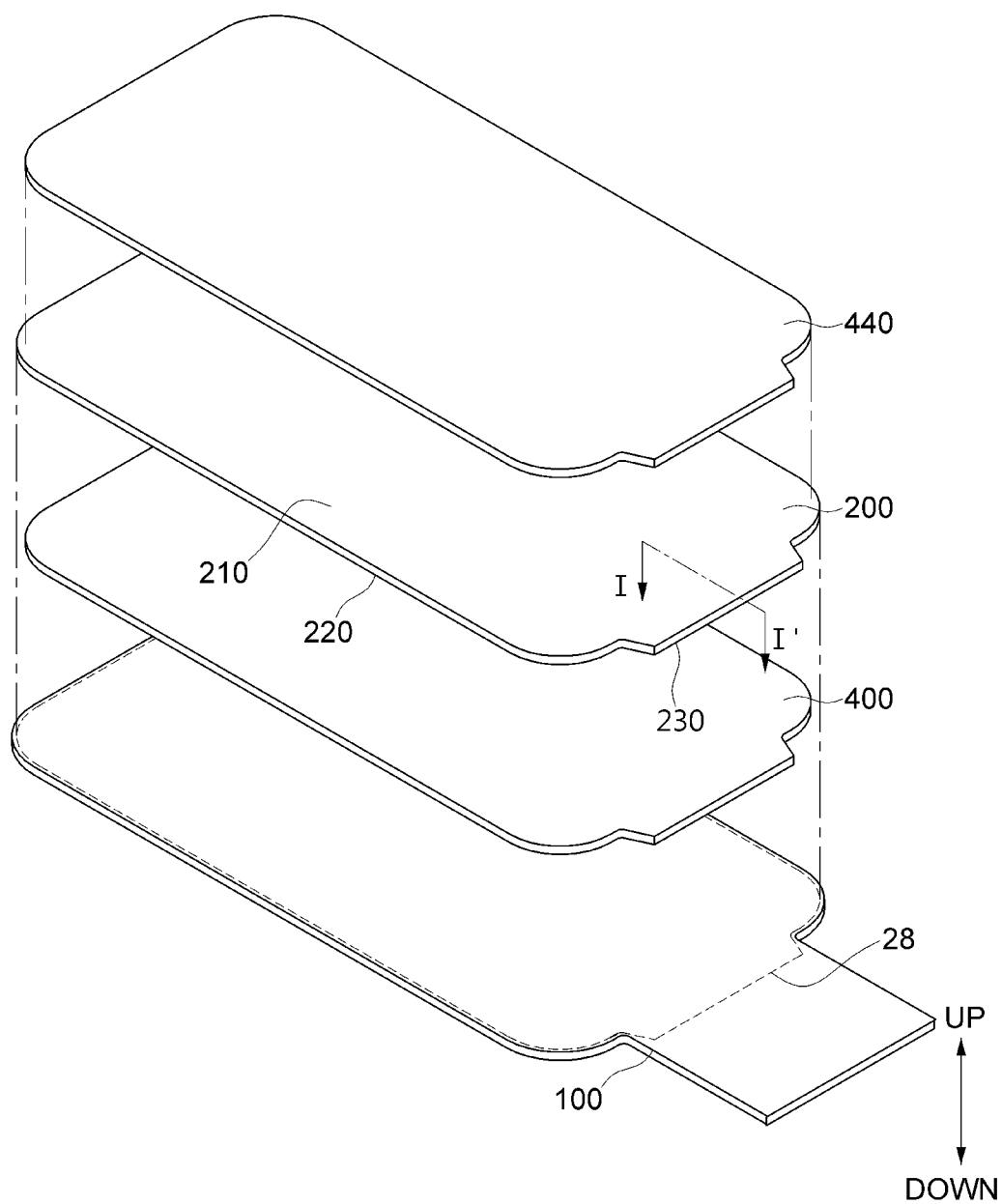
FIG. 6 is an exploded perspective view illustrating an OLED display device.

FIG. 6 is an exploded perspective view illustrating an OLED display device.

Referring to FIG. 6, the OLED display panel 100 includes the passivation layer 28. The passivation layer 28 may cover the upper edge, the left edge, and the right edge of the upper flat portion 71 (refer to FIG. 1) of the OLED display panel 100, and expose a part of the lower side of the upper flat portion 71 of the OLED display panel 100.

The adhesive layer 400 is attached to the lower surface 220 of the polarizing film, and a release film 440 is disposed on the upper surface 210 of the polarizing film. The release film 440 serves to protect the upper surface 210 of the polarizing film 200, and may be omitted in some cases.

In addition, the polarizing film 200 is disposed on the passivation layer 28 so that the adhesive layer 400 on the lower surface 220 of the polarizing film 200 contacts the upper surface of the passivation layer 28. The polarizing film 200 may have a planar shape substantially the same as the planar shape of the passivation layer 28. The polarizing film 200 may already have the final shape before being attached. In an alternative exemplary embodiment, the final shape of the polarizing film 200 may be processed through a cutting process using laser or the like after being attached.

Hereinafter, the shape of the polarizing film of the OLED display device will be described in detail with reference to FIGS. 7 to 13.

Figure 7:
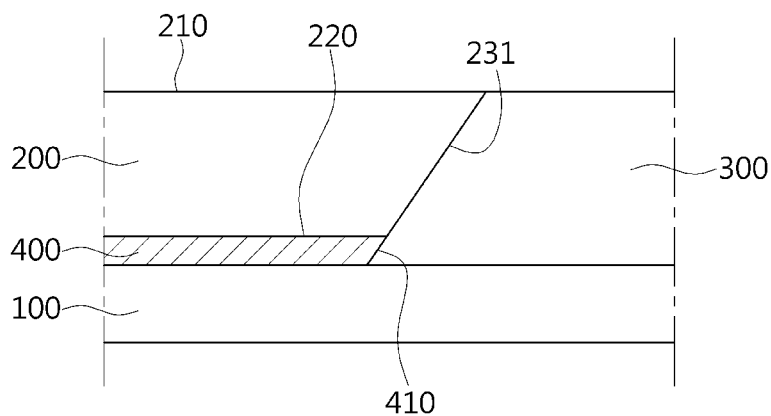
FIGS. 7 to 13 are schematic cross-sectional views illustrating an exemplary embodiment of an OLED display device according to the invention.

FIG. 7 shows a polarizing film 200 in which the side surface 230 (refer to FIG. 5) comprised of a first surface 231, which is one plane, and the inclination angle of the side surface 230 (or the internal angle between the lower surface 220 and the side surface 230) is an obtuse angle. Accordingly, the side surface 230 protrudes further, as closer to the upper side, in the entire area of the side surface 230. In addition, the entire side surface 230 faces downwardly (the direction from the upper surface 210 to the lower surface 220, the same hereinafter).

The concept of that one surface faces downwardly does not only mean that the surface is perpendicular to a back surface thereof, but also means that an outward direction perpendicular to the surface crosses the back surface (or an imaginary planar surface extending from the back surface). The concept of that one surface faces upwardly means that an outward direction perpendicular to the surface crosses an upper surface (or an imaginary planar surface extending from the upper surface).

The bending protection layer 300 contacting the side surface 230 that faces downwardly is disposed beneath the side surface 230 in the thickness direction. Accordingly, the upward restoring force of the bending protection layer 300 may be canceled. In addition, the contact surface is larger when the side surface 230 at which the polarizing film 200 contacts the bending protection layer 300 is inclined, as compared to the case where the side surface 230 is perpendicular thereto.

The inclination angle of the side surface 230 of the polarizing film 200 is an obtuse angle, that is, greater than about 90 degrees and less than about 180 degrees. As the inclination angle increases, the adhesive force with the bending protection layer 300 increases, but the risk of breakage of the polarizing film 200 also increases. Accordingly, the inclination angle of the side surface 230 of the polarizing film 200 may be in a range from about 110 degrees to about 160 degrees, and more desirably, in a range from about 130 degrees to about 140 degrees, for example.

The side surface 410 of the adhesive layer 400 may be located on a plane substantially the same as a plane on which the side surface 230 of the polarizing film 200 is disposed. However, the invention is not limited thereto, and the side surface of the adhesive layer 400 may be perpendicular to the lower surface 220, which is also applied to the following embodiments, and a description thereof will be omitted.

Figure 8:
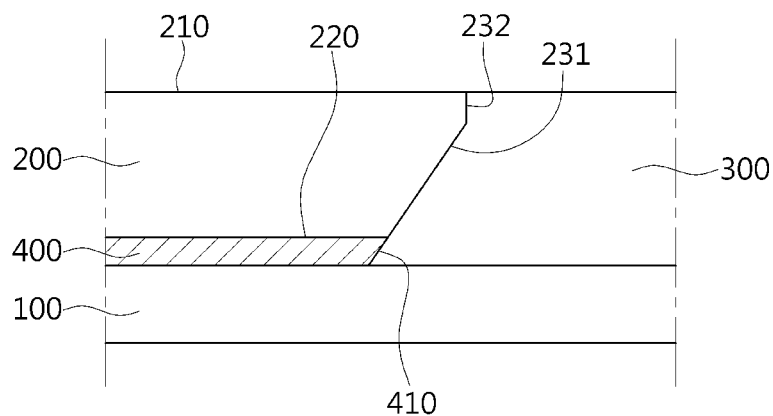

FIG. 8 shows a polarizing film 200 of which the side surface 230 (refer to FIG. 5) includes two planes that cross each other. The side surface 230 of the polarizing film 200 includes a first surface 231 which contacts the lower surface 220 of the polarizing film 200 and is inclined downwardly, and a second surface 232 which contacts the upper surface 210 of the polarizing film 200 and is perpendicular to the upper surface 210. The first surface 231 and the second surface 232 contact each other between the upper surface 210 and the lower surface 220. An inclination angle of the first surface 231 is substantially equal to an inclination angle of the side surface 230 of the polarizing film 200 described with reference to FIG. 7.

A length of the second surface 232 in the thickness direction (e.g., vertical direction in FIG. 8) may be substantially equal to or less than a length of the first surface 231 in the thickness direction.

Since an upper end of the side surface 230 of the polarizing film 200 described with reference to FIG. 7 is sharp, there is a greater risk of breakage even when the inclination angle of the side surface 230 is reduced. Accordingly, the polarizing film 200 illustrated in FIG. 8 includes a surface that is perpendicular to the upper surface 210 at the upper end of the side surface 230, thereby reducing the risk of breakage.

Figure 9:
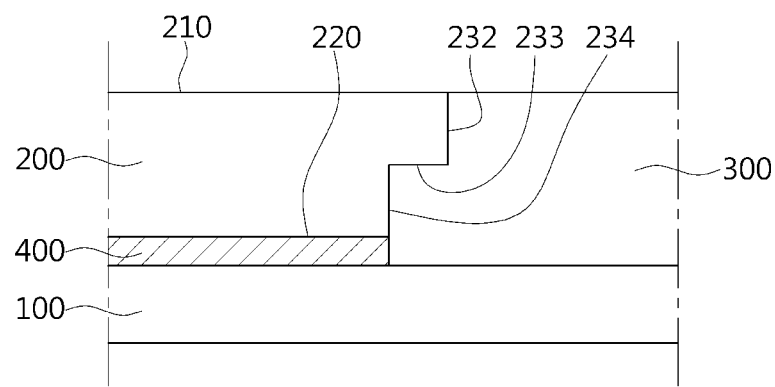

FIG. 9 shows a polarizing film 200 of which the side surface 230 (refer to FIG. 5) includes three planes. The side surface 230 of the polarizing film 200 has a step-like shape that includes a first surface 234 which contacts the lower surface 220 and is perpendicular to the lower surface, a second surface 232 which contacts the upper surface and is perpendicular to the upper surface, and a third surface 233 which contacts the first surface 234 and the second surface 232 and is parallel to the lower surface 220. The third surface 233 parallel to the lower surface 220 faces downwardly. Although it is illustrated in FIG. 9 that the third surface 233 is parallel to the lower surface 220, the invention is not limited thereto. In an exemplary embodiment, the third surface 233 may have an arbitrary inclination angle greater than about 90 degrees and less than about 180 degrees, for example. In addition, the third surface may have an inclination angle greater than about 180 degrees and less than about 270 degrees, for example.

Although FIG. 9 illustrates one plane 233 parallel to the lower surface 220, a plurality of planes parallel to the lower surface 220 and spaced apart from each other in the thickness direction may be provided. That is, the side surface 230 of the polarizing film 200 may have a pattern of a plurality of steps.

In the case of the polarizing film 200 illustrated in FIG. 9, a contact area between the side surface 230 and the bending protection layer 300 may be larger than that of the obtuse inclination surface 230 illustrated in FIG. 7, and a force of pressing the bending protection layer 300 may be larger than that of FIG. 7.

Figure 10:
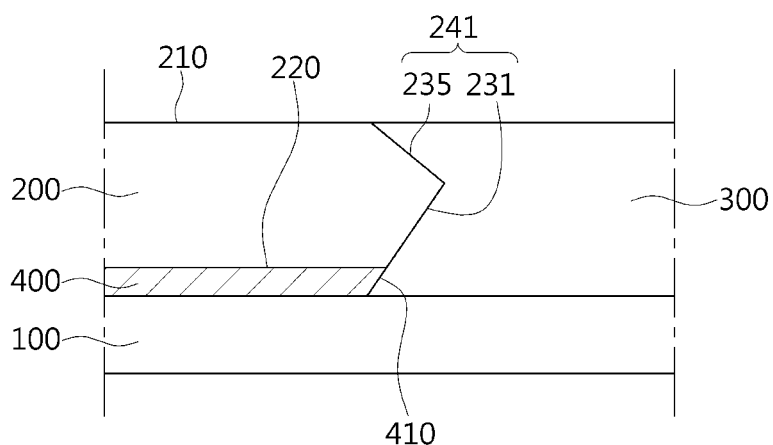
Figure 11:
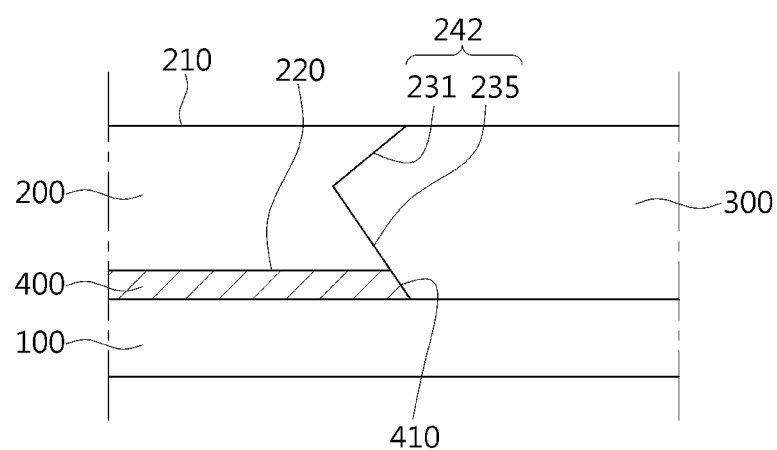

FIGS. 10 and 11 show a polarizing film having a protruding portion 241 which protrudes outwardly of the polarizing film 200 and a recessed portion 242 recessed inwardly of the polarizing film 200.

The side surface 230 (refer to FIG. 5) of the polarizing film 200 includes a first surface 231 which protrudes more, as closer to the upper side, and faces downwardly, and a second surface 235 which protrudes more, as closer to the lower side, and faces upwardly. The second surface 235 is disposed at an upper portion of the protruding portion 241, while the second surface 235 is disposed at a lower portion of the recessed portion 242. The first surface 231 and the second surface 235 may be symmetric in the thickness direction of the polarizing film 200.

Figure 12:
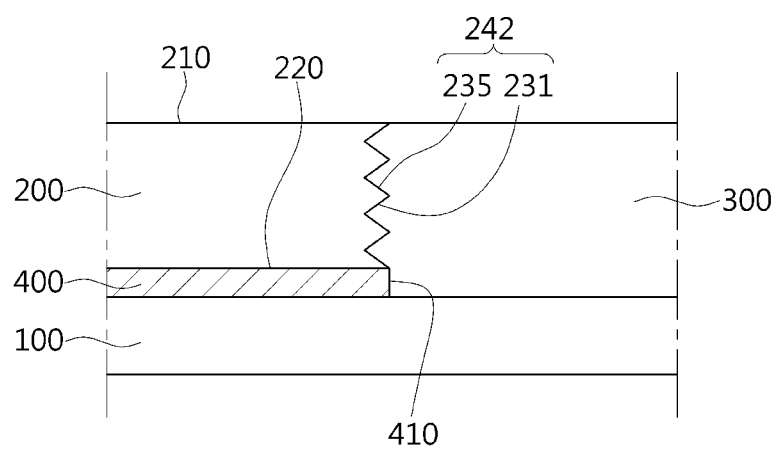

FIG. 12 shows a polarizing film having a pattern of a protruding portion 241 (refer to FIG. 10) or a recessed portion 242 (refer to FIG. 11). A pattern where the protruding portion 241 or the recessed portion 242 are regularly repeated in the thickness direction may be disposed on the side surface 230 (refer to FIG. 5) of the polarizing film 200. Each of the protruding portion 241 or the recessed portion 242 may extend parallel to the lower surface 220. In an alternative exemplary embodiment, the protruding portion 241 or the recessed portion 242 may be inclined at an oblique angle with respect to the lower surface 220, for example, at about 45 degrees.

Figure 13:
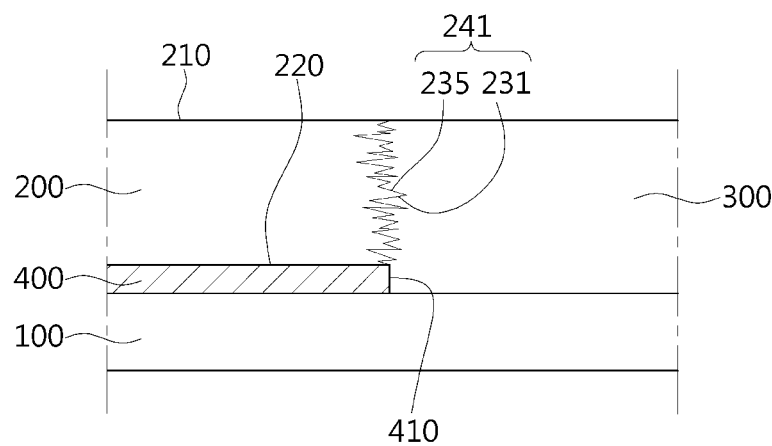

FIG. 13 shows a polarizing film 200 having a pattern in which a protruding portion 241 (refer to FIG. 10) or a recessed portion 242 (refer to FIG. 11) are irregularly repeated in the thickness direction. The irregular pattern may be provided by rough polishing or the like.

Figure 14:
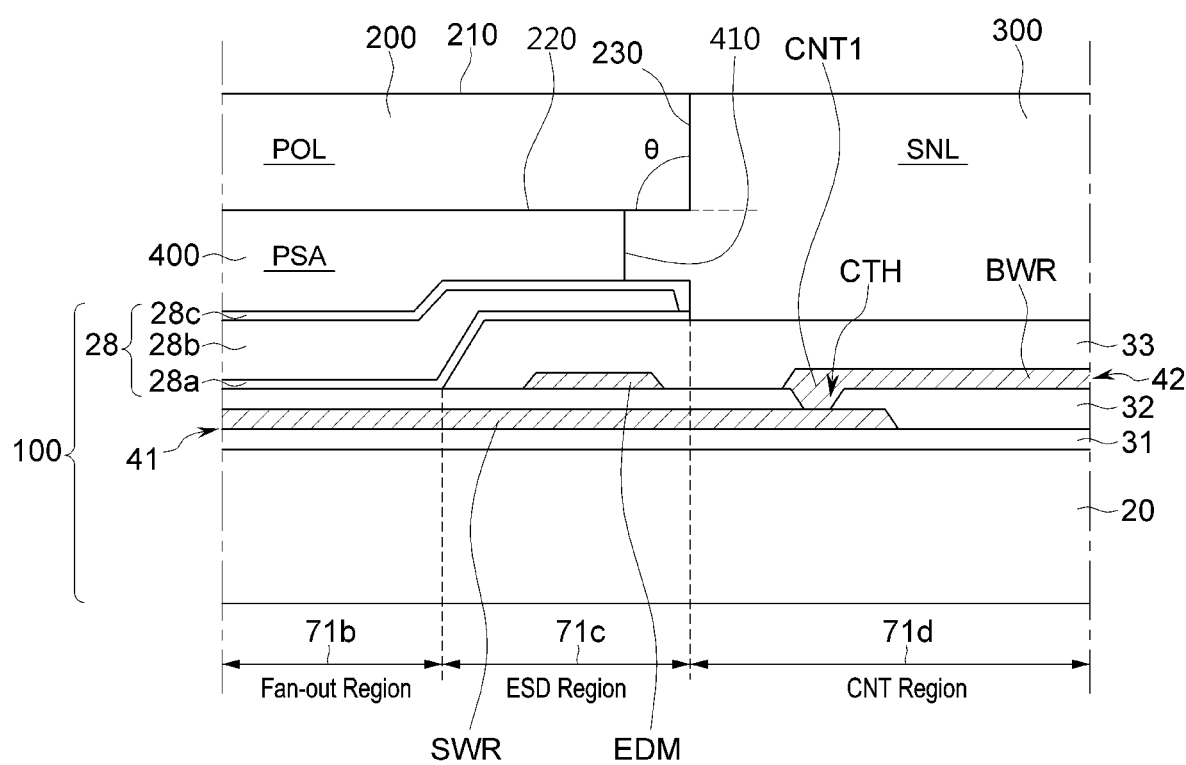
FIG. 14 is a schematic cross-sectional view illustrating an exemplary embodiment of an OLED display device according to the invention.

FIG. 14 is a schematic cross-sectional view illustrating an OLED display device according to an exemplary embodiment of the invention.

Since the description of FIG. 14 is substantially the same as that of FIG. 5, excluding the structure and disposition of the polarizing film 200 and the adhesive layer 400, redundant description will be omitted.

As illustrated in FIG. 14, a part of the lower surface 220 of the polarizing film 200 contacts the bending protection layer 300 at the edge BEG (refer to FIG. 1) of the polarizing film 200 that contacts the bending protection layer 300. Accordingly, the side surface 410 of the adhesive layer 400 and the side surface 230 of the polarizing film 200 are misaligned such that the side surface 410 of the adhesive layer 400 and the side surface 230 of the polarizing film 200 do not contact each other. The shape of the upper surface of the adhesive layer 400 is less than the shape of the lower surface 220 of the polarizing film 200, at the edge in contact with the bending protection layer 300. Accordingly, the lower surface 220 of the polarizing film 200 is not covered by the adhesive layer 400 at the edge in contact with the bending protection layer 300.

The bending protection layer 300 is disposed between the lower surface 220 of the polarizing film 200 and the display panel 100. The bending protection layer 300 contacts the side surface 230 and the lower surface 220 of the polarizing film 200. The bending protection layer 300 may contact the side surface 410 of the adhesive layer 400.

In an exemplary embodiment, the lower edge BEG of the polarizing film 200 may be aligned with the lower edge of the passivation layer 28. Accordingly, the adhesive layer 400 and the lower edge of the passivation layer 28 are misaligned such that the upper surface of the passivation layer 28 is not covered by the adhesive layer 400 at the edge in contact with the bending protection layer 300. The bending protection layer 300 is disposed between the lower surface 220 of the polarizing film 200 and the passivation layer 28. The bending protection layer 300 contacts the side surface 230 and the lower surface 220 of the polarizing film 200, and contacts the upper surface and the side surface of the passivation layer 28. The bending protection layer 300 may contact the side surface 410 of the adhesive layer 400.

As illustrated in FIG. 14, the side surface 230 of the polarizing film 200 may be perpendicular to the lower surface 220, or may have a shape in which the upper side protrudes as illustrated in FIGS. 7 to 13.

In an exemplary embodiment of the invention, since the adhesive layer 400 forms a space between the polarizing film 200 and the display panel 100, and the bending protection layer 300 is disposed in a space between the display panel 100 and the polarizing film 200 at which the adhesive layer 400 is absent, the bending protection layer 300 may be substantially prevented from being detached upwardly.

FIGS. 15A to 15G are cross-sectional views illustrating a method for fabricating a polarizing film according to an exemplary embodiment of the invention.

Figure 15A:
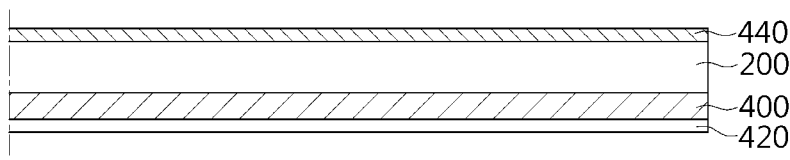
FIGS. 15A to 15J are cross-sectional views illustrating an exemplary embodiment of a method for fabricating a polarizing film according to the invention.

First, referring to FIG. 15A, the adhesive layer 400 is attached to the lower surface of the polarizing film 200, and a protective film 420 is attached to the lower surface of the adhesive layer 400. In addition, the release film 440 is attached to the upper surface of the polarizing film 200. Several sets of the polarizing film 200, the adhesive layer 400, the protective film 420, and the release film 440 attached to each other are prepared. The protective film 420 may substantially prevent the adhesive layer 400 from adhering to another film in a manufacturing process of the polarizing film 200 described below.

Figure 15B:
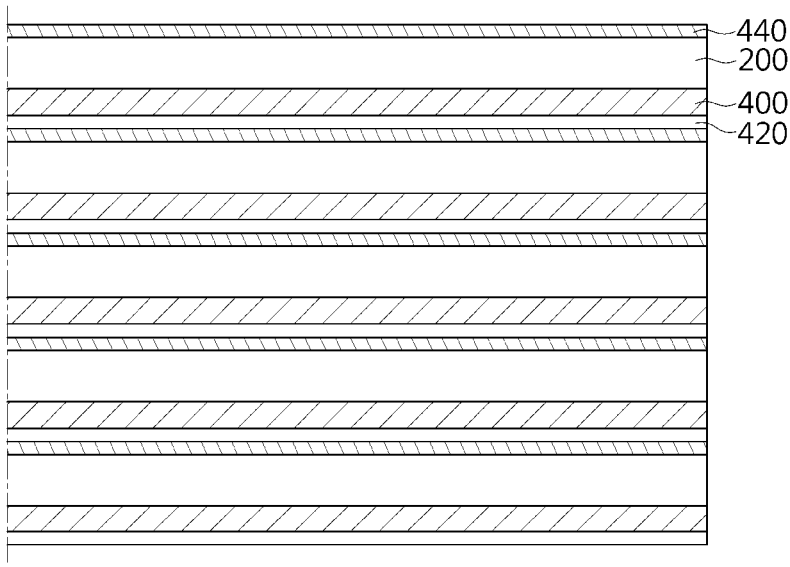

Next, as illustrated in FIG. 15B, the several units of the polarizing film 200, the adhesive layer 400, the protective film 420, and the release film 440 attached to each other are stacked on each other.

Figure 15C:
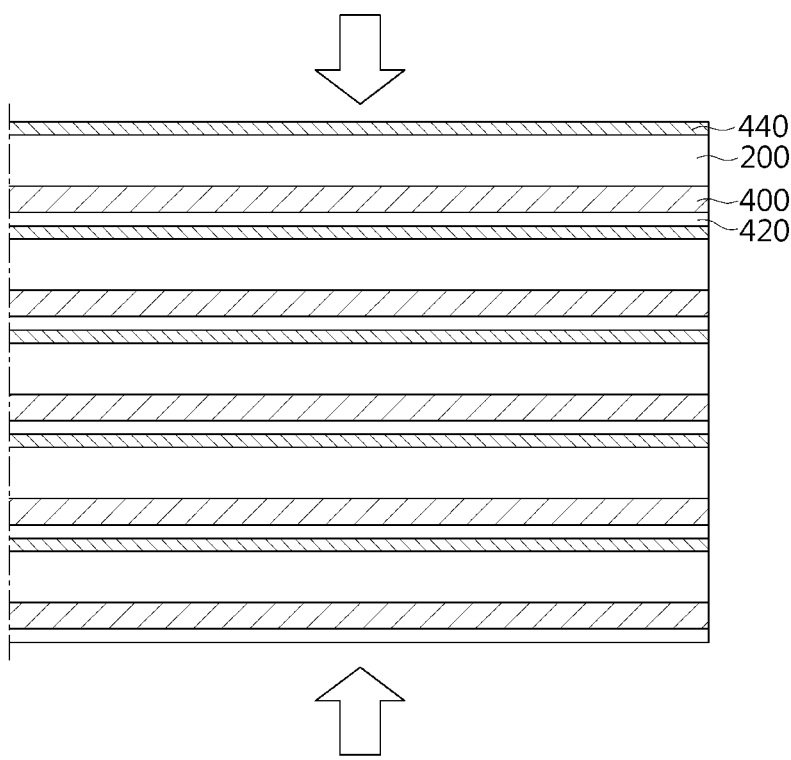

Then, as illustrated in FIG. 15C, the polarizing film 200, the adhesive layer 400, the protective film 420, and the release film 440 that are stacked to overlap each other are pressed in the thickness direction.

Figure 15D:
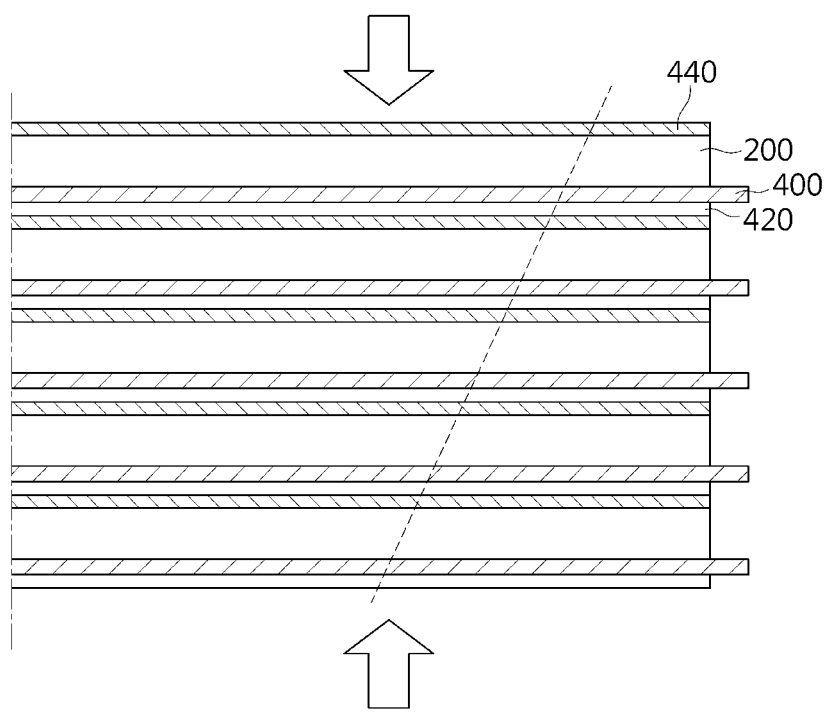

As described above, the adhesive layer 400 may include a PSA, for example. As illustrated in FIG. 15D, when the adhesive layer 400 is pressed, the adhesive layer 400 is reduced in its thickness direction by the elastic force thereof, and stretched in the horizontal direction perpendicular to the thickness direction.

Figure 15E:
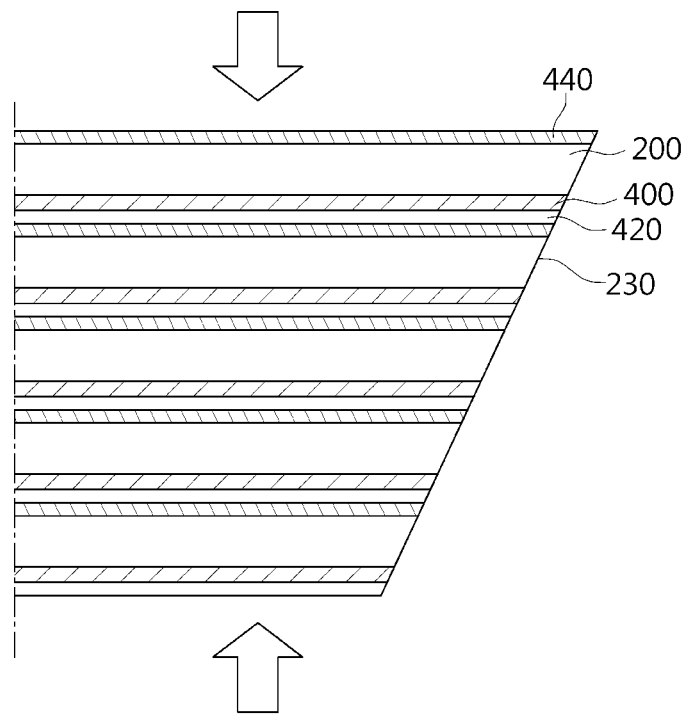

Then, as illustrated in FIG. 15E, the stacked polarizing film 200 is cut or polished in the pressed state in an oblique direction as illustrated in FIG. 7 (or in a perpendicular direction as illustrated in FIG. 14) with respect to the lower surface 220 of the polarizing film 200. The internal angle between the side surface 230 and the lower surface 220 of the polarizing film 200 that is cut or polished may be an obtuse angle (refer to FIG. 7) or a right angle (refer to FIG. 14). The side surface 230 of the cut or polished polarizing film 200 may have the shape of the side surface 230 illustrated in FIGS. 8 to 13.

Figure 15F:
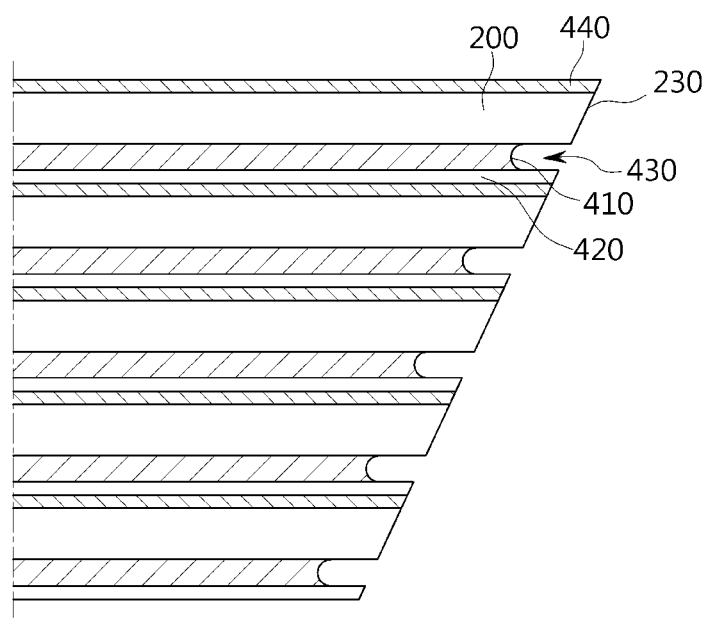

Next, the pressure applied to the stacked films is released after cutting. As illustrated in FIG. 15F, when the pressure is released, the adhesive layer 400 is stretched in the thickness direction by its restoring force and contracts in the horizontal direction. The side surface 410 of the adhesive layer 400 may be recessed inwardly due to the adhesive force with the protective film 420 or the polarizing film 200. The adhesive layer 400 attached to the lower surface 220 of one edge of the polarizing film 200 is removed, and an empty space 430 (refer to FIG. 15F) without the adhesive layer 400 is defined beneath the lower surface 220 of one edge of the polarizing film 200.

Figure 15G:
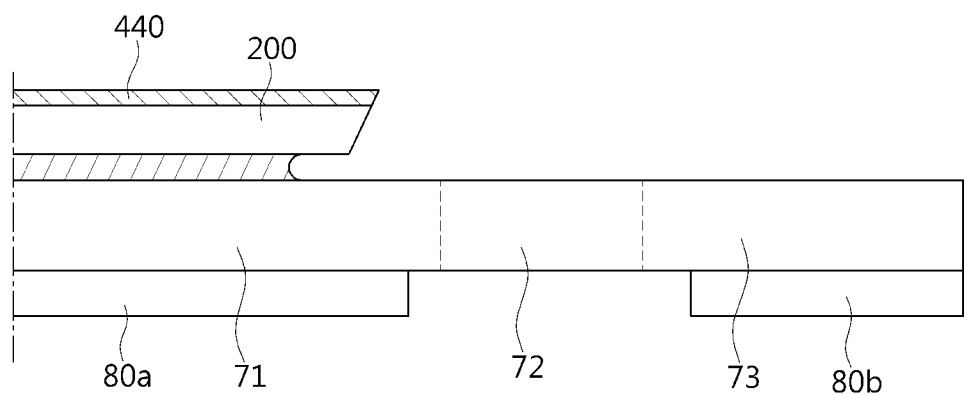

Next, as illustrated in FIG. 15G, the protective film 420 attached to the lower surface of the adhesive layer 400 is removed, and the lower surface of the adhesive layer 400 is attached to the upper flat portion 71 of the display panel 100 (refer to FIGS. 6 to 14). Accordingly, the empty space 430 is defined between the upper flat portion 71 of the display panel 100 and the polarizing film 200. The bending portion 72 is not bent yet and is flat, and the pattern films 80a and 80b may be attached beneath the upper flat portion 71 and the lower flat portion 73 before bending.

Figure 15H:
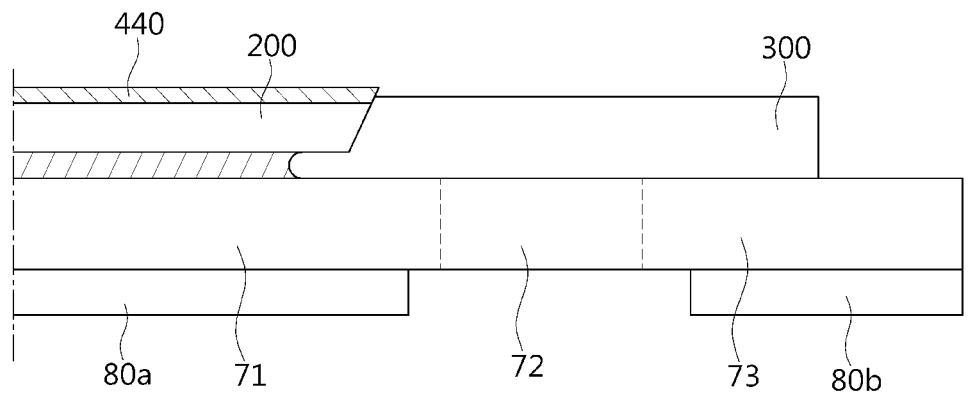

Next, as illustrated in FIG. 15H, the bending protection layer 300 is disposed over the upper flat portion 71, the bending portion 72, and the lower flat portion 73 of the display panel 100. The bending protection layer 300 is injected into the empty space 430 between the display panel 100 and the lower surface 220 of the polarizing film 200 at which the adhesive layer 400 is absent, and at least a part of the bending protection layer 300 contacts the lower surface 220 of the polarizing film 200. In an exemplary embodiment, the height of the upper surface of the bending protection layer 300 may be substantially equal to or greater than the height of the upper surface 210 of the polarizing film 200, and may be substantially equal to or less than the height of the upper surface of the release film 440.

Figure 15I:
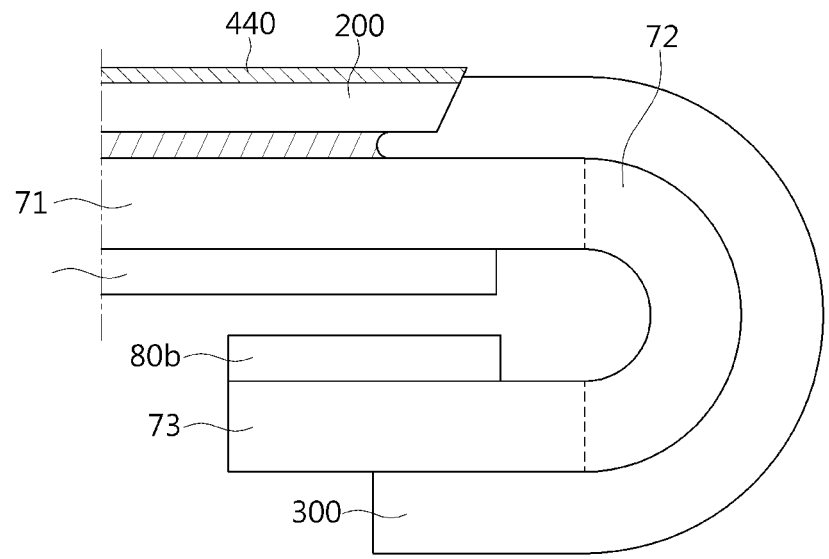

Next, as illustrated in FIG. 15I, the bending portion 72 provided with the bending protection layer 300 is bent. Accordingly, the bending protection layer 300 is also bent, and the restoring force to deviate upwardly from the upper flat portion 71 is generated. In an exemplary embodiment of the invention, the lower surface 220 and/or the inclined side surface 230 of the polarizing film 200 may more effectively prevent the deviation of the bending protection layer 300.

Figure 15J:
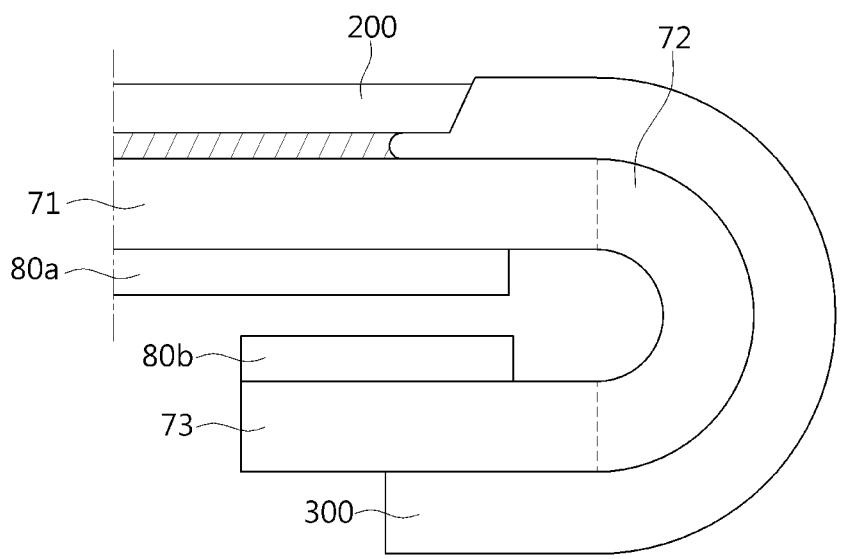

Next, as illustrated in FIG. 15J, the release film 440 attached to the upper surface 210 (refer to FIG. 5) of the polarizing film 200 may be removed. Accordingly, contamination of the polarizing film 200 in the manufacturing process of the display device 70 may be removed, or the breakage of the polarizing film 200 may be substantially prevented.

As set forth hereinabove, according to one or more embodiments of the present invention, at least one side surface of the optical film in contact with the bending protection layer faces downwardly, and accordingly, the bending protection layer may be substantially prevented from being detached upwardly.

While the invention has been illustrated and described with reference to the exemplary embodiments thereof, it will be apparent to those of ordinary skill in the art that various changes in form and detail may be formed thereto without departing from the spirit and scope of the invention.

What is claimed is:

1. A display device comprising:
   a display panel comprising a flat portion and a bending portion located at a side of the flat portion;
   an optical film attached on the flat portion of the display panel; and
   a bending protection layer covering at least a part of the bending portion and contacting an edge of the optical film,
   wherein the edge of the optical film includes an upper surface, a lower surface and a side surface,
   the lower surface of the optical film faces an upper surface of the display panel,
   at least a part of the side surface of the optical film contacts the bending protection layer,
   at least a part of the side surface of the optical film protrudes more closer to the upper surface, and
   wherein the display panel comprises a passivation layer, and
   the edge of the optical film is aligned with an edge of the passivation layer.

2. The display device of claim 1, wherein an internal angle between at least a part of the side surface of the optical film and the lower surface of the optical film is an obtuse angle.

3. The display device of claim 2, wherein the internal angle is greater than about 110 degrees.

4. The display device of claim 3, wherein the internal angle is greater than about 130 degrees.

5. The display device of claim 4, wherein the internal angle is less than about 160 degrees.

6. The display device of claim 1, wherein the side surface of the optical film is a planar surface.

7. The display device of claim 1, further comprising an adhesive layer between the optical film and the display panel,
   wherein a side surface of the adhesive layer contacts the side surface of the optical film.

8. The display device of claim 7, wherein the side surface of the adhesive layer has a slope substantially equal to a slope of the side surface of the optical film.

9. A display device comprising:
   a display panel comprising a flat portion and a bending portion located at a side of the flat portion;
   an optical film attached on the flat portion of the display panel; and
   a bending protection layer covering at least a part of the bending portion and contacting an edge of the optical film,
   wherein the edge of the optical film includes an upper surface, a lower surface and a side surface,
   the lower surface of the optical film faces an upper surface of the display panel,
   at least a part of the side surface of the optical film contacts the bending protection layer, and
   at least a part of the side surface of the optical film protrudes more closer to the upper surface, and
   wherein the side surface of the optical film comprises: a first surface which perpendicularly contacts the upper surface of the optical film.

10. The display device of claim 9, wherein the side surface of the optical film further comprises: a second surface contacting the first surface and the lower surface of the optical film.

11. The display device of claim 9, wherein the side surface of the optical film further comprises:
    a third surface contacting the first surface and parallel to the lower side of the optical film; and
    a fourth surface contacting the third surface and the lower surface of the optical film.

12. The display device of claim 1, wherein the side surface of the optical film comprises: a protruding portion or a recessed portion.

13. A display device comprising:
    a display panel comprising a flat portion and a bending portion located at a side of the flat portion;
    an optical film attached on the flat portion of the display panel; and
    a bending protection layer covering at least a part of the bending portion and contacting an edge of the optical film,
    wherein the edge of the optical film includes an upper surface, a lower surface and a side surface,
    the lower surface of the optical film faces an upper surface of the display panel,
    at least a part of the side surface of the optical film contacts the bending protection layer, and
    at least a part of the side surface of the optical film protrudes more closer to the upper surface, and
    wherein the side surface of the optical film comprises a pattern of protruding portions or recessed portions which are regularly arranged.

14. A display device comprising:
    a display panel comprising a flat portion and a bending portion located at a side of the flat portion;
    an optical film attached on the flat portion of the display panel; and
    a bending protection layer covering at least a part of the bending portion and contacting an edge of the optical film,
    wherein the edge of the optical film includes an upper surface, a lower surface and a side surface,
    the lower surface of the optical film faces an upper surface of the display panel,
    at least a part of the side surface of the optical film contacts the bending protection layer, and
    at least a part of the side surface of the optical film protrudes more closer to the upper surface, and
    wherein the side surface of the optical film comprises a pattern of protruding portions or recessed portions which are irregularly arranged.

15. The display device of claim 1, wherein the display panel comprises an organic light emitting display panel, and the optical film comprises a polarizing film.

16. The display device of claim 1, wherein at least a part of the lower surface of the optical film contacts the bending protection layer.

17. A display device comprising:
    a display panel comprising a flat portion and a bending portion located at a side of the flat portion;

an optical film attached on the flat portion of the display panel;
an adhesive layer between the display panel and the optical film; and
a bending protection layer covering at least a part of the bending portion and contacting an edge of the optical film,
wherein the optical film includes a lower surface which faces the display panel and an opposite facing upper surface, the lower surface and upper surface defining major surface planes defining the optical film, and
at least a part of the lower surface of the optical film contacts the bending protection layer.

18. A display device comprising:
a display panel comprising a flat portion and a bending portion located at a side of the flat portion;
an optical film attached on the flat portion of the display panel;
an adhesive layer between the display panel and the optical film; and
a bending protection layer covering at least a part of the bending portion and contacting an edge of the optical film,
wherein the edge of the optical film includes a lower surface which faces the display panel, and
at least a part of the lower surface of the optical film contacts the bending protection layer, and
wherein at least a part of the lower surface of the optical film is not covered by the adhesive layer.

19. The display device of claim 17, wherein the bending protection layer contacts a side surface of the adhesive layer.

20. A display device comprising:
a display panel comprising a flat portion and a bending portion located at a side of the flat portion;
an optical film attached on the flat portion of the display panel;
an adhesive layer between the display panel and the optical film; and
a bending protection layer covering at least a part of the bending portion and contacting an edge of the optical film,
wherein the edge of the optical film includes a lower surface which faces the display panel, and
at least a part of the lower surface of the optical film contacts the bending protection layer, and
wherein a side surface of the adhesive layer is a concavely curved surface which is recessed inwardly.

21. The display device of claim 17, wherein the display panel comprises a passivation layer, and
the edge of the optical film is aligned with an edge of the passivation layer.

* * * * *